United States Patent
Ahmed et al.

(10) Patent No.: US 9,070,510 B2
(45) Date of Patent: Jun. 30, 2015

(54) FREQUENCY TUNING AND STEP CONTROL OF A DIGITALLY CONTROLLED OSCILLATOR

(71) Applicant: Intel IP Corporation, Santa Clara, CA (US)

(72) Inventors: Rizwan Ahmed, Chandler, AZ (US); Darin Nguyen, Phoenix, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 13/715,704

(22) Filed: Dec. 14, 2012

(65) Prior Publication Data

US 2014/0167871 A1    Jun. 19, 2014

(51) Int. Cl.
| | | |
|---|---|---|
| *H03B 5/12* | (2006.01) | |
| *H01G 2/00* | (2006.01) | |
| *H03L 7/099* | (2006.01) | |
| *H01G 4/38* | (2006.01) | |
| *H01G 5/40* | (2006.01) | |

(52) U.S. Cl.
CPC ................. *H01G 2/00* (2013.01); *H03L 7/099* (2013.01); *H03L 2207/06* (2013.01); *H01G 4/38* (2013.01); *H01G 5/40* (2013.01)

(58) Field of Classification Search
CPC ....... H03B 5/12; H03B 5/1243; H03L 7/0991
USPC ......... 331/11 FE, 117 R, 117 FE, 167, 177 V
See application file for complete search history.

(56) References Cited

U.S. PATENT DOCUMENTS

| | | | | |
|---|---|---|---|---|
| 7,064,622 B2* | 6/2006 | Jasa et al. | ................... | 331/117 R |
| 7,567,139 B2* | 7/2009 | Tsukizawa | ................ | 331/177 V |
| 8,000,428 B2 | 8/2011 | Staszewski et al. | ........... | 375/362 |
| 2008/0012654 A1* | 1/2008 | Han et al. | ....................... | 331/167 |
| 2009/0085681 A1* | 4/2009 | Lin et al. | ......................... | 331/111 |
| 2009/0302958 A1 | 12/2009 | Sakurai et al. | ................. | 331/1 A |
| 2010/0102894 A1 | 4/2010 | Sun et al. | ....................... | 331/1 A |
| 2011/0248787 A1* | 10/2011 | Jiang | ....................... | 331/117 FE |
| 2013/0107978 A1* | 5/2013 | Thaller et al. | .................. | 375/295 |

FOREIGN PATENT DOCUMENTS

CN         103944515 A        7/2014

OTHER PUBLICATIONS

Sameni et al.; "Modeling of MOS Varactors and Characterizing the Tuning Curve of a 5-6GHz LC VCO" ; Circuits and Systems 2005, vol. 5, IEEE International Symposium; pp. 5071-5074, 2005.

* cited by examiner

*Primary Examiner* — Joseph Chang
*Assistant Examiner* — Jeffrey Shin
(74) *Attorney, Agent, or Firm* — Baker Botts L.L.P.

(57) ABSTRACT

A variable leaf capacitor is disclosed. In accordance with some embodiments of the present disclosure, a variable leaf capacitor may comprise a first alternating current coupling capacitor having a first terminal coupled to a first differential node and a second terminal coupled to a first common-mode node, a second alternating current coupling capacitor having a first terminal coupled to a second differential node and a second terminal coupled to a second common-mode node, and a varactor having a bias terminal, a first common-mode terminal coupled to the first common-mode node, and a second common-mode terminal coupled to the second common-mode node, wherein the capacitance of the varactor is based on the voltage from the first common-mode terminal of the varactor to the bias terminal of the varactor and on the voltage from the second common-mode terminal of the varactor to the bias terminal of the varactor.

10 Claims, 3 Drawing Sheets

FREQUENCY TUNING AND STEP CONTROL OF A DIGITALLY CONTROLLED OSCILLATOR

TECHNICAL FIELD

The present disclosure relates generally to electronic circuits and, more particularly, to variable capacitors for digitally controlled oscillators.

BACKGROUND

Digitally controlled oscillators ("DCOs") are used in a variety of integrated circuit applications. A critical performance parameter of a DCO is the frequency of its oscillating output signal. Some integrated circuit applications may require the oscillator frequency to be adjustable. In some applications, the oscillating frequency of a DCO may be based on the resonant frequency of an inductor-capacitor resonator ("LC-resonator"). In such applications, the oscillating frequency of the DCO may be adjusted by varying the capacitance in the LC-resonator. However, the tuning resolution of the frequency may be limited by the minimum step size of the variable capacitor. Moreover, a single fixed step size for the variable capacitor may result in different frequency tuning step sizes at different DCO frequency ranges.

SUMMARY

In accordance with some embodiments of the present disclosure, a variable leaf capacitor may comprise a first alternating current coupling capacitor having a first terminal coupled to a first differential node and a second terminal coupled to a first common-mode node, a second alternating current coupling capacitor having a first terminal coupled to a second differential node and a second terminal coupled to a second common-mode node, and a varactor having a bias terminal, a first common-mode terminal coupled to the first common-mode node, and a second common-mode terminal coupled to the second common-mode node, wherein the capacitance of the varactor is based on the voltage from the first common-mode terminal of the varactor to the bias terminal of the varactor and on the voltage from the second common-mode terminal of the varactor to the bias terminal of the varactor.

The object and advantages of the invention will be realized and attained by means of at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION

Figure 1:
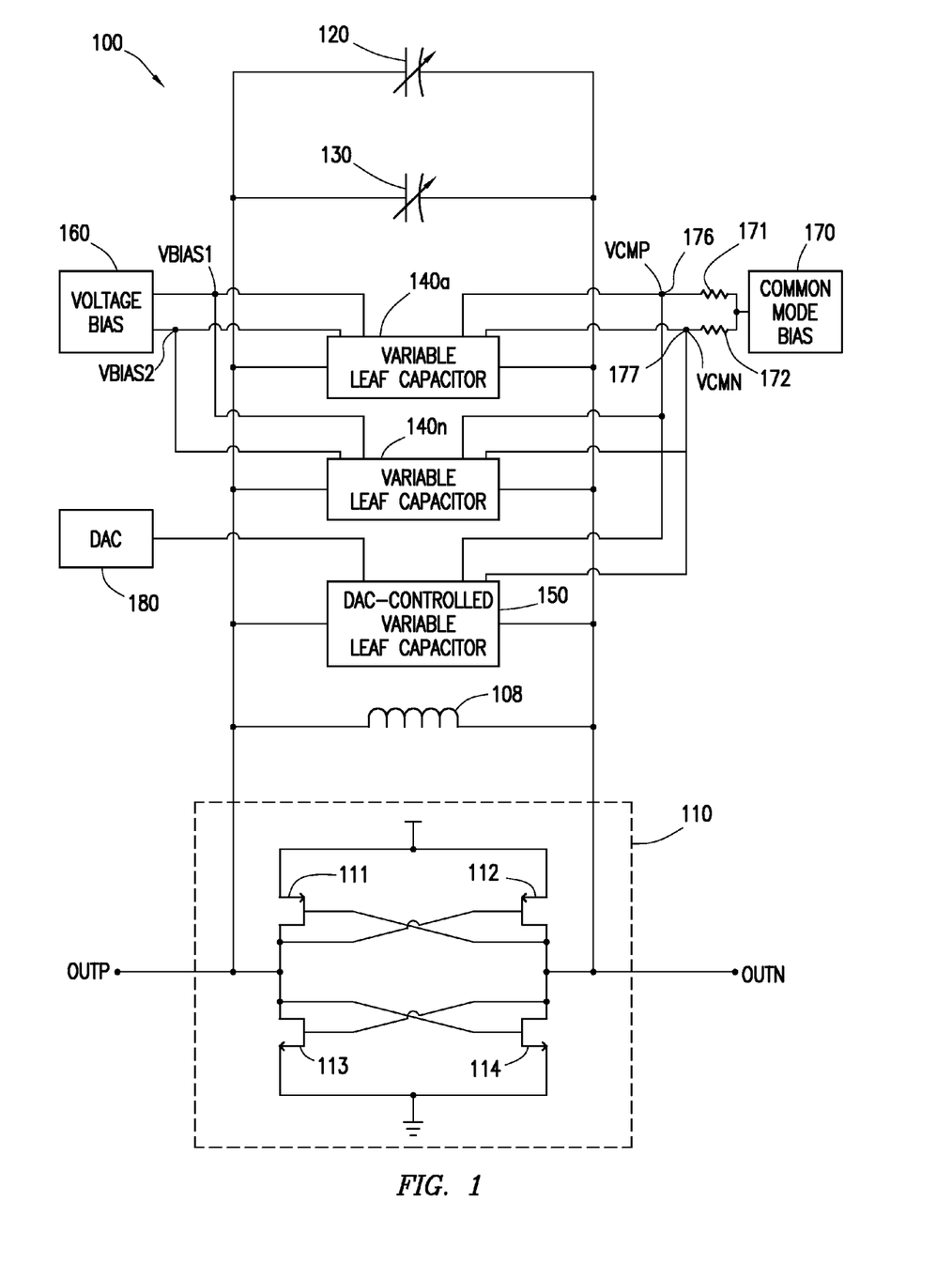
FIG. 1 depicts a schematic diagram of an example DCO, in accordance with certain embodiments of the present disclosure.

FIG. 1 depicts a schematic diagram of an example embodiment of digitally controlled oscillator ("DCO") 100, in accordance with certain embodiments of the present disclosure. DCO 100 may include differential oscillating outputs OUTN and OUTP, a gain stage 110, an inductor 108, a capacitor 120, a capacitor 130, one or more variable leaf capacitors 140, and a digital-to-analog converter ("DAC")-controlled variable leaf capacitor 150. In some embodiments, DCO may also include a voltage bias 160, a common-mode bias 170, resistors 171 and 172, and/or a DAC 180.

Gain stage 110 may be configured to apply a gain to a resonant oscillator signal across the OUTN and OUTP outputs of DCO 100. In some embodiments, gain stage 110 may include p-type metal-oxide semiconductor field-effect transistor ("PMOS") 112 that may have a gate coupled to OUTP, a drain coupled to OUTN, and a source coupled to a high-side power supply. Gain stage 110 may also include PMOS 111 that may have a gate coupled to OUTN, a drain coupled to OUTP, and a source coupled to a high side power supply. Likewise, gain stage 110 may include n-type metal-oxide semiconductor field-effect transistor ("NMOS") 114 that may have a gate coupled to OUTP, a drain coupled to OUTN, and a source coupled to ground. Gain stage 110 may also include NMOS 113 that may have a gate coupled to OUTN, a drain coupled to OUTP, and a source coupled to ground. Though FIG. 1 illustrates an embodiment of gain stage 110 including a particular set of NMOS and PMOS devices, gain stage 110 may be configured in any suitable manner, with any suitable number of any suitable types of devices, including, for example, NMOS, PMOS, bipolar junction transistor ("BJT"), metal-semiconductor field-effect transistor ("MESFET"), and/or heterojunction bipolar transistor ("HBT") devices.

Inductor 108 may have a first terminal coupled to OUTN and a second terminal coupled to OUTP. In some embodiments, inductor 108 may be a differential inductor, and may also include a common mode node (not expressly shown). Similarly, each of capacitor 120, capacitor 130, variable leaf capacitor 140, and DAC-controlled variable leaf capacitor 150 may have a first terminal coupled to OUTN and a second terminal coupled to OUTP. The oscillating frequency of DCO 100 may depend on the resonant frequency of inductor 108 and the total capacitance applied between OUTN and OUTP. For example, the oscillating frequency ("$f_o$") of DCO 100 may be as described by Equation 1:

$$f_o = \frac{1}{2\pi\sqrt{LC}}$$

where L may be the inductance value of inductor 108 and C may be the total combined capacitance value of capacitor 120, capacitor 130, variable leaf capacitor 140, DAC-controlled variable leaf capacitor 150, and any other parasitic capacitance associated with the OUTN and OUTP nodes.

The capacitance of capacitor 120 may be varied by any suitable means. For example, in some embodiments, capacitor 120 may include an array of individually selectable capacitors that may be switched in or out to contribute to the total capacitance of capacitor 120. Similarly, in some embodiments, the capacitance of capacitor 130 may be varied by any suitable means. For example, in some embodiments, capacitor 130 may include an array of individually selectable capacitors that may be switched in or out to contribute to the total capacitance of capacitor 130.

In some embodiments, capacitor 120 may be configured to provide for coarse tuning of DCO 100 and capacitor 130 may be configured to provide for a fine tuning of DCO 100. For example, capacitor 120 may have a relatively large variation range with relatively large step sizes as compared to capacitor 130. Capacitor 130 may have a relatively small variation range with relatively small step sizes as compared to capacitor 120. In such embodiments, the large variation of capacitor 120 may be utilized to coarsely tune DCO 100 to a desired frequency within a broad range of potential frequencies, and the small step size of capacitor 130 may be utilized to finely tune DCO 100 to the desired frequency. The fine tuning capabilities provided by capacitor 130 alone may, however, be limited by inherent characteristics of capacitor 130 and/or other design limitations. For example, the minimum step size of capacitor 130 may be affected by the number of control settings that are available and the fine-tuning range that may be required in a given application. Further, in some applications, the minimum step size may be limited, for example, by the minimum delta capacitance of the smallest varactor in a given process. Moreover, a given minimum capacitance step size for variable capacitor 130 may result in different frequency step sizes for DCO 100 at different frequency ranges. For example, in some embodiments, inductor 108 may be configured to be 1.0 nH, capacitor 120 may be configured to vary from approximately 1.0 pF to approximately 10.92 pF in thirty-two discrete steps with a step size of 320 fF, and capacitor 130 may be configured to vary from 100 fF to 410 fF in thirty-two discrete steps with a step size of approximately 10 fF. In such embodiments, if the total capacitance between OUTP and OUTN is set to approximately 4 pF, the frequency of DCO 100 may be tuned to approximately 2.52 GHz, and the fine-tuning frequency step resulting from increasing or decreasing the capacitance of capacitor 130 by 10 fF may be approximately 3.14 MHz. However, in such embodiments, if the total capacitance between OUTP and OUTN is set to approximately 8 pF, the frequency of DCO 100 may be tuned to approximately 1.78 GHz, and the fine-tuning frequency step resulting from increasing or decreasing the capacitance of capacitor 130 by 10 fF may be approximately 1.11 MHz.

Accordingly, additional techniques of varying the capacitance across OUTP and OUTN may be desired in order to provide an extra fine tuning resolution and to provide for a controllable frequency step size of DCO 100.

Variable leaf capacitor 140 and DAC-controlled leaf capacitor 150 may be configured to provide an extra fine tuning resolution as well as a controllable frequency step size for DCO 100. As shown in FIG. 1, DCO 100 may include any suitable number of variable leaf capacitors 140a-n to provide for any suitable extra fine tuning frequency range. Variable leaf capacitor 140, described in greater detail below with reference to FIG. 2, may include a varactor that may be varied based on one or more voltages biases provided by voltage bias 160. As shown in FIG. 1, in some embodiments, voltage bias 160 may provide two constant voltage biases VBIAS1 and VBIAS2. In some embodiments, however, voltage bias 160 may provide any suitable number of constant or dynamically controlled bias outputs. Variable leaf capacitor 140, may include a varactor that may also be varied based on a common-mode bias that may be provided by common-mode bias 170. Common-mode bias 170 may provide a common mode bias voltage signal VCM. As shown in FIG. 1, in some embodiments, common-mode bias 170 may be coupled to a first terminal of resistor 171 and to a first terminal of resistor 172. The second terminal of resistor 171 may be coupled to node 176. Similarly, the second terminal of resistor 172 may be coupled to node 177. As shown in FIG. 1, resistor 171 and resistor 172 may separate nodes 176 and nodes 177 and thus may prevent an electrical short between a first common mode signal VCMP at node 176 and a second common mode signal VCMN at node 177. In some embodiments, VCMP and VCMN may be provided to variable leaf capacitor 140 and DAC-controlled variable leaf capacitor 150.

DAC-controlled variable leaf capacitor 150, described in greater detail below with reference to FIG. 3, may include a varactor that may be varied based on a control voltage provided by DAC 180. DAC 180 may be controlled by any suitable number of digital bits. For example, DAC 180 may be a 4-bit DAC, 6-bit DAC, or any other suitable bit-number DAC. DAC 180 may be configured to output any suitable range of analog voltages. In some embodiments, DAC 180 may be configured to output voltages ranging from the voltage of VBIAS1 to the voltage of VBIAS2 as may be provided by voltage bias 160.

Figure 2:
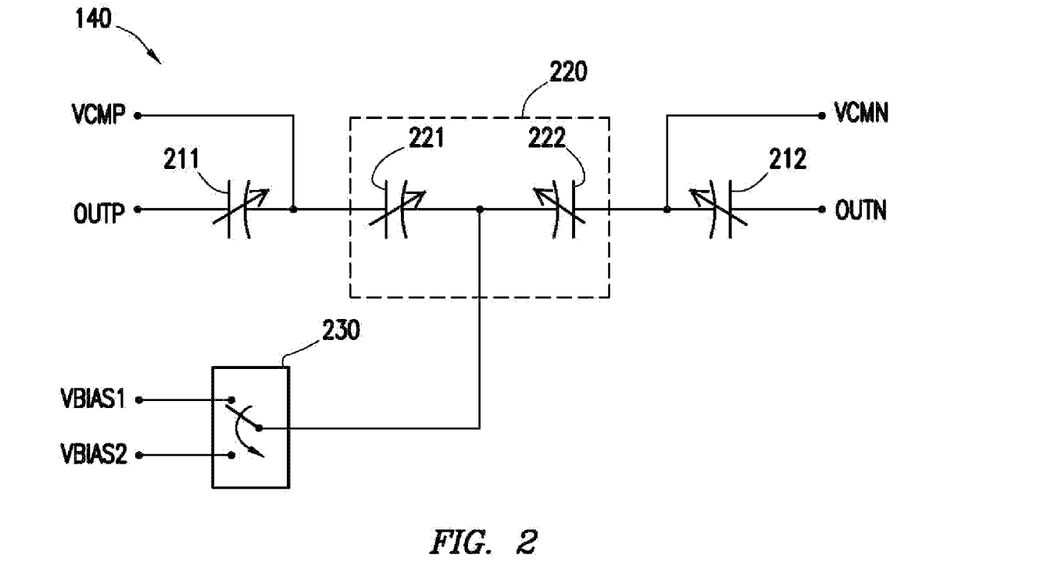
FIG. 2 depicts a schematic diagram of an example variable leaf capacitor, in accordance with certain embodiments of the present disclosure.

FIG. 2 depicts a schematic diagram of an example variable leaf capacitor 140, in accordance with certain embodiments of the present disclosure. Variable leaf capacitor 140 may include capacitor 211, capacitor 212, switch 230, varactor 220, and common-mode inputs VCMP and VCMN.

Capacitor 211 and capacitor 212 may be configured as alternating current ("AC") coupling capacitors. For example, in some embodiments, capacitor 211 may have a first terminal coupled to OUTP, and a second terminal coupled to a first common mode input VCMP. Similarly, in some embodiments, capacitor 212 may have a first terminal coupled to OUTN and a second terminal coupled to a second common-mode input VCMN. As described above in reference to FIG. 1, OUTP and OUTN may be the oscillating output terminals of DCO 100. For the purposes of the present invention, the nodes of variable leaf capacitor 140 coupled to OUTP and OUTN may also be referred to as differential nodes, and the total capacitance of variable leaf capacitor 140 may be the capacitance across the differential nodes. The VCMP and VCMN inputs may receive common-mode voltages provided by common-mode bias 170 via resistor 171 and resistor 172 respectively. The configuration of capacitor 211 and capacitor 212 as AC coupling capacitors may allow a common-mode bias to be applied to varactor 220 independent from the common-mode values of the oscillating OUTP and OUTN nodes.

In some embodiments, varactor 220 may include two voltage-dependent capacitors 221 and 222. Voltage-dependent capacitor 221 may have a first terminal coupled to the first common mode terminal of varactor 220 and a second terminal coupled to the bias terminal of varactor 220. The first common-mode terminal of varactor 220 may be coupled to the first common-mode input VCMP. Similarly voltage-dependent capacitor 222 may have a first terminal coupled to the second common-mode terminal of varactor 220 and a second terminal coupled to the bias terminal of varactor 220. The second common-mode terminal of varactor may be coupled to the second common-mode input VCMN.

The bias terminal of varactor 220 may be configured to be driven by a bias voltage. In some embodiments, variable leaf capacitor 140 may include a bias switch 230. In some embodiments, bias switch 230 may include a first input terminal that may be coupled to VBIAS1 and a second input terminal that may be coupled to VBIAS2. Bias switch 230 may also include an output that may be coupled to the bias terminal of varactor 220. Bias switch 230 may be controlled by a digital signal, and may be configured to apply a first bias voltage (e.g., VBIAS1) to varactor 220 in a first state or a second bias voltage (e.g., VBIAS2) to varactor 220 in a second state.

The capacitance of varactor 220 may vary as a function of the voltage from its first and second common-mode terminals to its bias terminal. In turn, the capacitance of variable leaf capacitor 140 may vary as a function of the varying capacitance of varactor 220. In some embodiments, the capacitance of variable leaf capacitor 140, with capacitor 211, varactor 220, and capacitor 212 coupled in series to each other, may be as described by Equation 2:

$$C_{140} = \frac{1}{\frac{1}{C_{211}} + \frac{1}{C_{212}} + \frac{1}{C_{var220}}}$$

where $C_{211}$ may be the capacitance of capacitor 211, $C_{212}$ may be the capacitance of capacitor 212, and $C_{var220}$ may be the capacitance of varactor 220. As described above, there may be multiple means of varying the voltage from the first and second common-mode terminals to the bias terminal of varactor 220, and accordingly, there may be multiple means of varying the capacitance of varactor 220, and in turn, the total capacitance of variable leaf capacitor 140. For example, in some embodiments, varying bias voltages may be applied to the bias terminal of varactor 220 via bias switch 230. In addition, a variable common-mode voltage may be applied to the first and second common-mode terminals of varactor 220 via the VCMP and VCMN inputs. Accordingly, in some embodiments, the capacitance across DCO 100 outputs OUTP and OUTN, and in turn the frequency of DCO 100, may be varied as a function of bias voltage applied to varactor 220 as well as the common-mode voltage applied to varactor 220.

Though some embodiments of varactor 220 may be modeled as depicted in FIG. 2, varactor 220 may include any number or any type of suitable devices that may have a capacitance that may vary based upon the voltage applied across the device. For example, varactor 220 may be formed as a diode-based varactor, a metal-oxide semiconductor ("MOS")-based varactor, or any other suitable voltage-dependent variable capacitive device. Moreover, varactor 220 may be driven in any suitable mode. For example, in embodiments including a MOS-based varactor, varactor 220 may be driven in depletion mode, accumulation mode, or inversion mode.

In some embodiments, the capacitance of variable leaf capacitor 140 may be varied by varying the capacitance of capacitor 211 and/or the capacitance of capacitor 212. Capacitor 211 and/or capacitor 212 may be varied by any suitable means. For example, in some embodiments, capacitor 211 may include an array of individually selectable capacitors that may be switched in or out to contribute to the total capacitance of capacitor 211. In some embodiments, capacitor 211 may include a varactor that may vary as a function of the voltage across the capacitor 211. Likewise, in some embodiments, capacitor 212 may include an array of individually selectable capacitors that may be switched in or out to contribute to the total capacitance of capacitor 212. In some embodiments, capacitor 212 may include a varactor that may vary as a function of the voltage across the capacitor 212.

For the purposes of the present invention, the term "variable leaf capacitor" may refer generically to any type of variable leaf capacitor, including a DAC-controlled variable leaf capacitor. The term "DAC-controlled variable leaf capacitor" may further indicate that the variable leaf capacitor may be controlled by a DAC.

Figure 3:
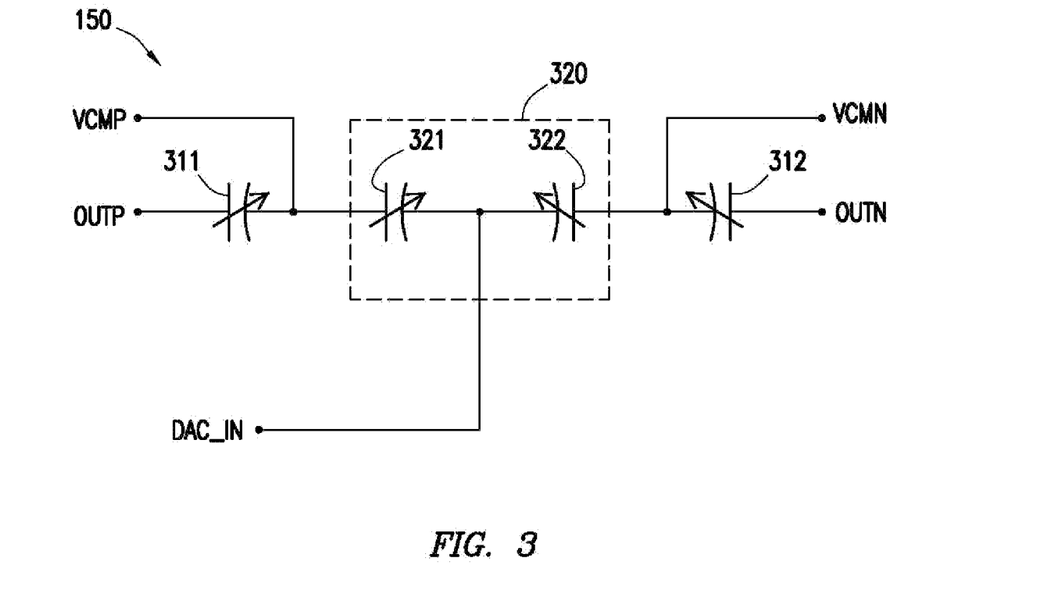
FIG. 3 depicts a schematic diagram of an example DAC-controlled variable leaf capacitor, in accordance with certain embodiments of the present disclosure.

FIG. 3 depicts a schematic diagram of an example embodiment of a DAC-controlled variable leaf capacitor 150. DAC-controlled variable leaf capacitor 150 may include capacitor 311, capacitor 312, varactor 320, and common-mode inputs VCMP and VCMN.

Capacitor 311 and capacitor 312 may be configured as AC-coupling capacitors. For example, in some embodiments, capacitor 311 may have a first terminal coupled to OUTP and a second terminal coupled to a first common-mode input VCMP. Similarly, in some embodiments, capacitor 312 may have a first terminal coupled to OUTN and a second terminal coupled to a second common-mode input VCMN. As described above in reference to FIG. 1, OUTP and OUTN may be the oscillating output terminals of DCO 100. For the purposes of the present invention, the nodes of DAC-controlled variable leaf capacitor 150 coupled to OUTP and OUTN may also be referred to as differential nodes, and the total capacitance of DAC-controlled variable leaf capacitor 150 may be the capacitance across the differential nodes. The VCMP and VCMN inputs may receive common-mode voltages provided by common-mode bias 170 via resistor 171 and resistor 172, respectively. The configuration of capacitor 311 and capacitor 312 as AC coupling capacitors may allow a common-mode bias to be applied to varactor 320 independent from the common mode of the oscillating OUTP and OUTN nodes.

In some embodiments, varactor 320 may include two voltage-dependent capacitors 321 and 322. Voltage-dependent capacitor 321 may have a first terminal coupled to the first common-mode terminal of varactor 320 and a second terminal coupled to the bias terminal of varactor 320. The first common-mode terminal of varactor 320 may be coupled to the first common-mode input VCMP. Similarly, voltage-dependent capacitor 322 may have a first terminal coupled to the second common-mode terminal of varactor 320 and a second terminal coupled to the bias terminal of varactor 320. The second common-mode terminal of varactor may be coupled to the second common-mode input VCMN.

The bias terminal of varactor 320 may be configured to be driven by a bias voltage. In some embodiments, DAC-controlled variable leaf capacitor 150 may include a DAC input DAC_IN coupled to the bias terminal of varactor 320. Accordingly, in some embodiments, the bias terminal of varactor 320 may be driven by DAC 180.

The capacitance of varactor 320 may vary as a function of the voltage from its first and second common-mode terminals to its bias terminal. In turn, the capacitance of DAC-controlled variable leaf capacitor 150 may vary as a function of the varying capacitance of varactor 320. In some embodiments, the capacitance of DAC-controlled variable leaf capacitor 150, with capacitor 311, varactor 320, and capacitor 312 coupled in series to each other, may be as described by Equation 3:

$$C_{150} = \cfrac{1}{\cfrac{1}{C_{311}} + \cfrac{1}{C_{312}} + \cfrac{1}{c_{var320}}}$$

where $C_{311}$ may be the capacitance of capacitor 311, $C_{312}$ may be the capacitance of capacitor 312, and $C_{var320}$ may be the capacitance of varactor 220. As described above, there may be multiple means of varying the voltage from the first and second common-mode terminals to the bias terminal of varactor 320, and accordingly, there may be multiple means of varying the capacitance of varactor 320, and in turn, the total capacitance of DAC-controlled variable leaf capacitor 150. For example, in some embodiments, varying bias voltages may be applied to the bias terminal of varactor 320 via DAC 180. In addition, a variable common-mode voltage may be applied to the first and second common-mode terminals of varactor 320 via the VCMP and VCMN inputs. Accordingly, in some embodiments, the capacitance across DCO 100 outputs OUTP and OUTN, and in turn the frequency of DCO 100, may be varied as a function of bias voltage applied to varactor 320 by DAC 180 as well as the common-mode voltage applied to varactor 320.

Though some embodiments of varactor 320 may be modeled as depicted in FIG. 3, varactor 320 may include any number or type of suitable devices that may have a capacitance that may vary based upon the voltage applied across the device. For example, varactor 320 may be formed as a diode-based varactor, a metal-oxide semiconductor ("MOS")-based varactor, or any other suitable variable capacitive device. Moreover, varactor 320 may be driven in any suitable mode. For example, in embodiments including a MOS-based varactor, varactor 220 may be driven in depletion mode, accumulation mode, or inversion mode.

In some embodiments, the capacitance of DAC-controlled variable leaf capacitor 150 may be varied by varying the capacitance of capacitor 311 and/or the capacitance of capacitor 312. Capacitor 311 and/or capacitor 312 may be varied by any suitable means. For example, in some embodiments, capacitor 311 may include an array of individually selectable capacitors that may be switched in or out to contribute to the total capacitance of capacitor 311. In some embodiments, capacitor 311 may include a varactor that may vary as a function of the voltage across the capacitor 311. Likewise, in some embodiments, capacitor 312 may include an array of individually selectable capacitors that may be switched in or out to contribute to the total capacitance of capacitor 312. In some embodiments, capacitor 312 may include a varactor that may vary as a function of the voltage across the capacitor 312.

Figure 4:
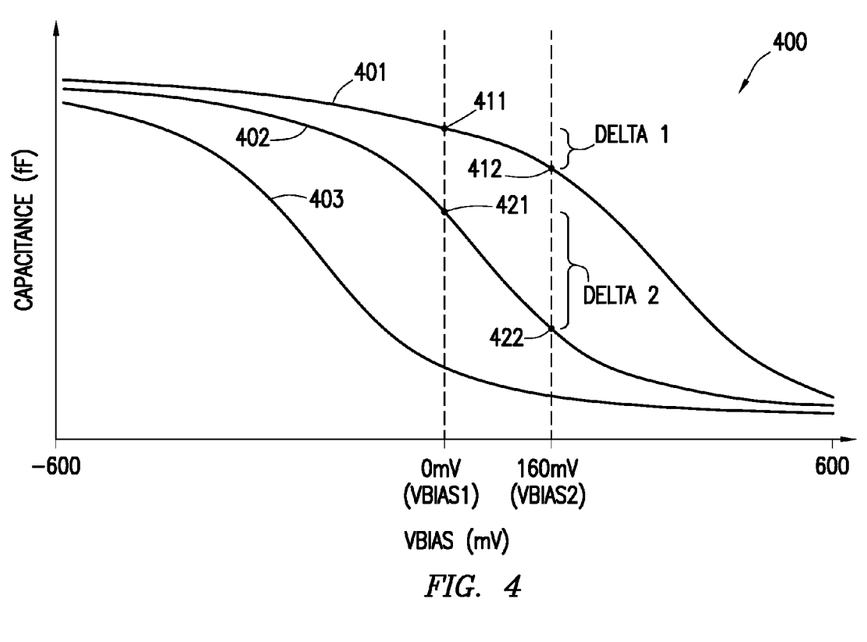
FIG. 4 depicts a graph illustrating example capacitance-voltage bias curves of an example variable leaf capacitor at multiple common-mode voltages, in accordance with certain embodiments of the present disclosure.

FIG. 4 depicts a graph 400 illustrating example capacitance-voltage bias curves ("C-V curves") of an example embodiment of variable leaf capacitor 140 at various common-mode voltages, in accordance with certain embodiments of the present disclosure. FIG. 4 may be referred to in conjunction with reference back to FIG. 2. The x-axis in graph 400 may represent a varying bias voltage applied to the bias terminal of varactor 220. The y-axis in graph 400 may represent the capacitance value of variable leaf capacitor 140. Curve 401 may represent the capacitance of variable leaf capacitor 140 as a function of the bias voltage at a first common-mode voltage. Similarly, curve 402 may represent the capacitance of variable leaf capacitor 140 as a function of the bias voltage at a second common-mode voltage. Curve 403, in turn, may represent the capacitance of variable leaf capacitor 140 as a function of the bias voltage at a third common-mode voltage.

In some embodiments, voltage bias 160 may provide, for example, a VBIAS1 of 0V and a VBIAS2 of 160 mV. As shown by curve 401, when the common-mode voltage is set to a first common-mode value, variable leaf capacitor 140 may have a first capacitance represented by point 411 at a bias voltage of 0V, and a second capacitance represented by point 412 at a bias voltage of 160 mV. Similarly, as shown by curve 402, when the common-mode voltage is set to a second common-mode value, variable leaf capacitor 140 may have a third capacitance represented by point 421 at a bias voltage of 0V, and a fourth capacitance represented by point 422 at a bias voltage of 160 mV. As shown in FIG. 4, the capacitive step between points 411 and 412 may be smaller than the capacitive step between points 421 and 422. Accordingly, the step size of the capacitor variation caused by a given bias voltage variation may itself be varied based on common-mode voltage that may be applied to the VCMP and VCMN inputs of variable leaf capacitor 140. Though curves 401, 402, and 403 illustrate the C-V curve of variable leaf capacitor 140 at three discrete common-mode voltages, the common-mode voltage applied via VCMP and VCMN may be varied in any number of discrete steps, and thus may provide any suitable number of potential step-size variations for variable leaf capacitor 140.

Graph 400 of FIG. 4 may also be illustrative of the C-V curves for some embodiments of DAC-controlled variable leaf capacitor 150 as shown in FIG. 3. In some embodiments, curve 401 may represent the C-V characteristics of DAC-controlled variable leaf capacitor 150 at a first common-mode voltage, curve 402 may represent its C-V characteristics at a second common-mode voltage, and curve 403 may represent its C-V characteristics at a third common-mode voltage. However, as opposed to some embodiments of variable leaf capacitor 140 where the bias voltage may be one of VBIAS1 and VBIAS2, for example, the bias voltage applied to DAC-controlled variable leaf capacitor 150 may be varied across any suitable range of values in any suitable number of steps. In some embodiments where DAC 180 may be a 6-bit DAC, and the output range of DAC 180 may be set from 0V to 160 mV, and DAC 180 may set the bias voltage of varactor 320 to any one of 64 discrete settings ranging from 0V to 160 mV. In such embodiments, the capacitance of DAC-controlled variable leaf capacitor 150 may be represented by any one of 64 discrete capacitances along curve 401 from point 411 to point 412 when the common-mode voltage is set to a first value. Similarly, in such embodiments, the capacitance of DAC-controlled variable capacitor 150 may be represented by any one of 64 discrete capacitances along curve 402 from point 421 to point 422 when the common-mode voltage is set to a second value. As shown in FIG. 4, the capacitive range between points 411 and 412 may be smaller than the capacitive range between points 421 and 422. Accordingly, the capacitive step size resulting from varying the output of DAC 180 may itself be varied based on the common-mode voltage that may be applied. Though curves 401, 402, and 403 may represent the C-V curve of DAC-controlled variable leaf capacitor 150 at three discrete common-mode voltages, the common-mode voltage applied at VCMP and VCMP (as illustrated in FIG. 3) may be varied in any number of discrete steps, and thus may provide any suitable number of potential capacitive step-size variations for DAC-controlled variable leaf capacitor 150.

In some embodiments, variable leaf capacitor 140 and/or DAC-controlled variable leaf capacitor 150 may be configured to provide DCO 100 with an additional means of tuning DCO 100 as well as a means of controlling the step size of the varying capacitance across OUTP and OUTN such that a substantially consistent frequency tuning step size may be maintained across a wide range of potential frequencies.

For example, in some embodiments, DCO 100 may include inductor 108 that may have an inductance of 1.0 nH, capacitor 120, capacitor 130, DAC-controlled variable leaf capacitor 150, and sixty-four individual instantiations of variable leaf capacitor 140. Each instantiation of variable leaf capacitor 140 may be configured such that, at a first common mode voltage, the difference between its capacitance at a first bias voltage and its capacitance at a second bias voltage may be 0.203 fF. In other words, in reference to FIG. 4, variable leaf capacitor 140 may be configured such that the capacitance difference between point 411 and point 412 along curve 401 at a first common mode voltage may be approximately 0.203 fF. Likewise, each instantiation of variable leaf capacitor 140 may be configured such that, at a second common mode voltage, the difference between its capacitance at a first bias voltage and its capacitance at a second bias voltage may be 0.575 fF. In other words, in reference to FIG. 4, variable leaf capacitor 140 may be configured such that the capacitance difference between point 421 and point 422 along curve 402 at a second common mode voltage may be approximately 0.575 fF.

In such embodiments, if the total capacitance across OUTP and OUTN is set to approximately 4 pF and the frequency of DCO 100 is roughly tuned to approximately 2.52 GHz, the common-mode bias 170 may be configured to provide a first common-mode voltage and the resulting 0.203 fF capacitive step size for each of the sixty-four variable leaf capacitors 140 may provide sixty-four frequency tuning settings with a step size of 64 KHz. If DCO 100 is later configured to output a different frequency, the common mode voltage may be adjusted such that the frequency step size may be maintained. For example, if the total capacitance across OUTP and OUTN is adjusted to approximately 8 pF and the frequency of DCO 100 is roughly tuned to approximately 1.78 GHz, common-mode bias 170 may be configured to provide a second common-mode voltage and the resulting 0.575 fF capacitive step size for each of the sixty-four variable leaf capacitors 140 may provide sixty-four frequency tuning settings with a step size of 64 KHz.

In such embodiments, the sixty-four instantiations of variable leaf capacitor 140 that each may have a 64 KHz step size, may provide a total tuning range of approximately 4 MHz. In some embodiments, such a tuning range may be sufficient to allow a Phase-Locked Loop ("PLL"), in which DCO 100 may be incorporated, to stay locked. In some alternative embodiments, however, DCO 100 may include any suitable number of variable leaf capacitors 140, which may be configured to have any suitable capacitive range.

In some embodiments, DAC-controlled variable leaf capacitor 150 may be configured to match variable leaf capacitor 140. For example, in some embodiments, capacitor 311 in DAC-controlled variable leaf capacitor 150 may be configured to match capacitor 211 in variable leaf capacitor 140, and capacitor 312 in DAC-controlled variable leaf capacitor 150 may be configured to match capacitor 212 in variable leaf capacitor 140. Likewise, in some embodiments, varactor 320 in DAC-controlled variable leaf capacitor 150 may be configured to match varactor 220 in variable leaf capacitor 140.

Moreover, in some embodiments, DAC-controlled variable leaf capacitor 150 may be configured to operate in conjunction with variable leaf capacitor 140. For example, DAC 180 may be configured as a 6-bit DAC with an analog output ranging from the first bias voltage provided by voltage bias 160 (e.g., VBIAS1) to the second bias voltage provided by voltage bias 160 (e.g., VBIAS2). Further, DAC-controlled variable leaf capacitor 150 may be configured such that, at a first common mode voltage, the difference between its capacitance at the lowest DAC setting and its capacitance at the highest DAC setting may be 0.203 fF. In other words, in reference to FIG. 4, DAC-controlled variable leaf capacitor 150 may be configured such that its capacitance may be any one of 64 discrete settings across a range of 0.203 fF along curve 401 between point 411 and point 412. Likewise, DAC-controlled variable leaf capacitor 150 may be configured such that, at a second common mode voltage, the difference between its capacitance at the lowest DAC setting and its capacitance at the highest DAC setting may be 0.575 fF. In other words, in reference to FIG. 4, DAC-controlled variable leaf capacitor 150 may be configured such that its capacitance may be any one of 64 discrete settings across a range of 0.575 fF along curve 402 between point 421 and point 422.

In such embodiments, if the total capacitance across OUTP and OUTN is set to approximately 4 pF and the frequency of DCO 100 is roughly tuned to approximately 2.52 GHz, the common-mode bias 170 may be configured to provide a first common-mode voltage, and the 64 DAC-controlled settings along the 0.203 fF variable capacitance range may provide 64 settings along a 64 KHz range with a step size of approximately 1 KHz. If DCO 100 is later configured to output a different frequency, the common mode voltage may be adjusted such that an approximately equal frequency step size may be maintained. For example, if the total capacitance across OUTP and OUTN is adjusted to approximately 8 pF and the frequency of DCO 100 is roughly tuned to approximately 1.78 GHz, common-mode bias 170 may be configured to provide a second common-mode voltage, and the 64 DAC controlled settings along the 0.575 fF variable capacitance range may provide 64 settings along a 64 KHz range with a step size of approximately 1 KHz. Accordingly, in some embodiments, DAC-controlled variable leaf capacitor 150 and 64 instantiations of variable leaf capacitor 140 may be operated in conjunction with each other to provide for a extra-fine tuning of DCO 100 across a range of 4 MHz with a minimum step size of 1 KHz at multiple different tuning frequency ranges.

Example embodiments are described above with specific values to provide for example calculations of frequencies for DCO 100. However, the various values described for voltage bias 160, common-mode bias 170, capacitor 120, capacitor 130, variable leaf capacitor 140, and DAC-controlled variable leaf capacitor 150, for example, are merely exemplary. Any other suitable values may be used to achieve a desired tuning resolution as well as a controllable frequency tuning step size across a range of different frequencies for DCO 100. For example, smaller capacitance values may be used for some embodiments of DAC-controlled variable leaf capacitor 150 to achieve a tuning resolution finer than 1 KHz. In such embodiments, smaller capacitance values may be used to achieve, for example, a resolution of 800 Hz or less.

As described above, the capacitance of variable leaf capacitor 140 and DAC-controlled variable leaf capacitor 150 may depend on both the common-mode voltage and the bias voltage. As described above, in some embodiments, the step size for a given variation of the bias voltage may be set by controlling the common-mode voltage, and the capacitance of the device may then be controlled by setting the bias voltage. In some embodiments, the roles of the bias voltage and the common-mode voltage may be reversed. For example, in some embodiments, the step size for a given variation of the common-mode voltage may be set by controlling the bias voltage, and the capacitance of the device may then be controlled by setting the common-mode voltage.

In some embodiments, the matching between variable leaf capacitor 140 and DAC-controlled variable leaf capacitor 150 may provide improved tuning performance of DCO 100. For example, when the AC-coupling capacitors 311 and 312 and the varactor 320 in DAC-controlled variable leaf capacitor 150 match the respective AC-coupling capacitors 211 and 212 and the varactor 220 in instantiations of variable leaf capacitor 140, the common-mode setting of variable leaf capacitor 140 and DAC-controlled variable leaf capacitor 150 can be controlled together via the same common-mode voltage signals. Matching corresponding components and driving those components with the same common-mode voltage signals VCMP and VCMN may allow the physical semiconductor layout of the devices to be located closely to each other, optimizing the physical matching of the respective devices. Accordingly, physical mismatches due to unintended semiconductor processing effects may be minimized, and in turn, any frequency tuning gaps introduced by physically mismatched components may be eliminated or minimized.

Moreover, although some embodiments of variable leaf capacitor 140 and DAC-controlled variable leaf capacitor 150 are described above as being operated in conjunction with each other to perform a single fine-tuning scheme, some embodiments of variable leaf capacitor 140 and some embodiments of DAC-controlled variable leaf capacitor 150 may be controlled and/or operated independently of each other.

For some embodiments of DCO 100, capacitor 120 may be described as providing a "coarse" tune, capacitor 130 may be described as providing a "fine" tune, and DAC-controlled variable leaf capacitor 150 and variable leaf capacitor 140 may be described as providing an "extra fine" tune. However, the terms "coarse," "fine," and "extra fine" merely indicate potential relative tuning resolutions as compared to other methods of tuning that may be available in a given embodiment of DCO 100. For example, in some embodiments, DCO 100 may include capacitor 120 and DAC-controlled variable leaf capacitor 150, and in such embodiments, capacitor 120 may be varied such that it provides a "coarse" tune as compared to DAC-controlled variable leaf capacitor 150, and DAC-controlled variable leaf capacitor 150 may be varied such at it provides a "fine" tune as compared to capacitor 120.

Figure 5:
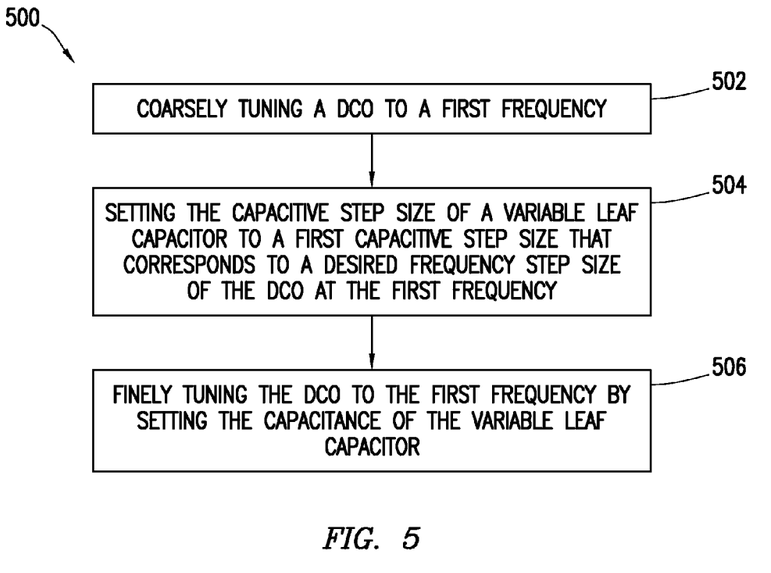
FIG. 5 depicts a flow chart of an example method for tuning a DCO, in accordance with certain embodiments of the present disclosure.

FIG. 5 depicts a flow chart of an example method 500 for tuning DCO 100, in accordance with certain embodiments of the present disclosure.

At step 502, method 500 may require coarsely tuning DCO 100 to a desired frequency. In some embodiments, DCO 100 may include an LC-resonator formed by an inductor 108 and one or more capacitive elements such as capacitor 120, capacitor 130, variable leaf capacitor 140, and/or DAC-controlled variable leaf capacitor 150. The frequency of the digitally controlled oscillator may depend on the inductance of inductor 108 and the total capacitance of the capacitive elements. The frequency of DCO 100 may be coarsely tuned by adjusting the inductance of inductor 108 and/or by adjusting the capacitance of, for example, capacitor 120 and/or capacitor 130.

At step 504, method 500 may require setting the capacitive step-size of a variable leaf capacitor such as variable leaf capacitor 140 or DAC-controlled variable leaf capacitor 150 to a capacitive step size that corresponds to a desired frequency tuning step size of the digitally controlled oscillator 100 at the desired frequency. In some embodiments, the capacitance of variable leaf capacitor may depend on a bias voltage and a common-mode voltage, and the capacitive step size achieved by a variation of the bias voltage may be dependent on the common-mode voltage.

Accordingly, in some embodiments, setting the capacitive step size of the variable leaf capacitor may comprise setting the common-mode voltage.

At step 506, method 500 may require finely tuning DCO 100 to the desired frequency by setting the capacitance of the variable leaf capacitor. In some embodiments, setting the capacitance of the variable leaf capacitor may comprise setting the bias voltage applied to the variable leaf capacitor.

Although FIG. 5 discloses a particular number of steps to be taken with respect to method 500, method 500 may be executed with greater or lesser steps than those depicted in FIG. 5. For example, method 500 may be executed with steps 504 and 506. In addition, although FIG. 5 discloses a certain order of steps to be taken with respect to method 500, the steps comprising method 500 may be completed in any suitable order. For example, step 502 may be taken after step 504.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:

1. A digitally controlled oscillator, comprising:
   a gain stage;
   an inductor;
   a variable capacitor; and
   a first variable leaf capacitor comprising:
      a first alternating current coupling capacitor having a first terminal coupled to a first differential node and a second terminal coupled to a first common-mode node;
      a second alternating current coupling capacitor having a first terminal coupled to a second differential node and a second terminal coupled to a second common-mode node; and
      a varactor having a bias terminal coupled to a variable voltage bias, a first common-mode terminal coupled to the first common-mode node, and a second common-mode terminal coupled to the second common-mode node, wherein the capacitance of the varactor is based on the voltage from the first common-mode terminal of the varactor to the bias terminal of the varactor and on the voltage from the second common-mode terminal of the varactor to the bias terminal of the varactor; and a second variable leaf capacitor comprising:
  a first alternating current coupling capacitor having a first terminal coupled to the first differential node and a second terminal coupled to the first common-mode node;
  a second alternating current coupling capacitor having a first terminal coupled to the second differential node and a second terminal coupled to the second common-mode node; and
  a varactor having a bias terminal coupled to an output of a digital-to-analog converter, a first common-mode terminal coupled to the first common-mode node, and a second common-mode terminal coupled to the second common-mode node, wherein the capacitance of the varactor is based on the voltage from the first common-mode terminal of the varactor to the bias terminal of the varactor and on the voltage from the second common-mode terminal of the varactor to the bias terminal of the varactor;

wherein the variable voltage bias is configured to drive the bias terminal of the varactor of the first variable leaf capacitor to one of a first bias voltage and a second bias voltage to tune the digitally controlled oscillator; and wherein the digital-to-analog converter is configured to drive the bias terminal of the varactor of the second variable leaf capacitor to one of a plurality of bias voltage settings to further tune the digitally controlled oscillator, the plurality of bias voltage settings ranging from approximately the first bias voltage to approximately the second bias voltage and comprising at least one intermediate setting between the first bias voltage and the second bias voltage.

2. The digitally controlled oscillator of claim 1, wherein:
the first alternating current coupling capacitor of the first variable leaf capacitor matches the first alternating current coupling capacitor of the second variable leaf capacitor;
the second alternating current coupling capacitor of the first variable leaf capacitor matches the second alternating current coupling capacitor of the second variable leaf capacitor; and
the varactor of the first variable leaf capacitor matches the varactor of the second variable leaf capacitor.

3. A method for tuning a digitally controlled oscillator, comprising:
coarsely tuning a digitally controlled oscillator to a first frequency, wherein the frequency of the digitally controlled oscillator depends on an inductor and the total capacitance of one or more capacitive elements including a first and a second variable leaf capacitor, wherein the respective capacitances of the first and second variable leaf capacitors depend on a common-mode voltage applied to both of the first and second variable leaf capacitors and on a first bias voltage applied to the first variable leaf capacitor and a second bias voltage applied to the second variable leaf capacitor;
setting the capacitive range of each of the first and second variable leaf capacitors to a first capacitive range by setting the common-mode voltage to a first common-mode voltage value, the first capacitive range corresponding to a first desired frequency range of the digitally controlled oscillator at the first frequency;
providing the first bias voltage to a bias terminal of the first variable leaf capacitor with a variable voltage bias;
finely tuning the digitally controlled oscillator to the first frequency by setting the first bias voltage to one of a first bias voltage setting and a second bias voltage setting;
providing the second bias voltage to a bias terminal of the second variable leaf capacitor with an output of a digital-to-analog converter (DAC); and
extra-finely tuning the digitally controlled oscillator to the first frequency by setting the second bias voltage to one of a plurality of bias voltage settings, the plurality of bias voltage settings ranging from approximately the first bias voltage setting to approximately the second bias voltage setting and comprising at least one intermediate setting between the first bias voltage setting and the second bias voltage setting.

4. The method of claim 3, comprising:
coarsely tuning the digitally controlled oscillator to a second frequency;
setting the capacitive range of each of the first and second variable leaf capacitors to a second capacitive range by setting the common-mode voltage to a second common-mode voltage value, the second capacitive range corresponding to a second desired frequency range of the digitally controlled oscillator at the second frequency;
finely tuning the digitally controlled oscillator to the second frequency by setting the first bias voltage to one of a third bias voltage setting and a fourth bias voltage setting; and
extra-finely tuning the digitally controlled oscillator to the second frequency by setting the second bias voltage to one of a second plurality of bias voltage settings, the second plurality of bias voltage settings ranging from approximately the third bias voltage setting to approximately the fourth bias voltage setting and comprising at least one intermediate setting between the third bias voltage setting and the fourth bias voltage setting.

5. The method of claim 3, wherein finely tuning the digitally controlled oscillator further comprises varying the capacitance of a first alternating coupling capacitor and the capacitance of a second alternating current coupling capacitor.

6. A digitally controlled oscillator, comprising:
a gain stage;
an inductor;
a first variable leaf capacitor having a first bias terminal and a first pair of common-mode terminals, a capacitance of the first variable leaf capacitor dependent on voltages at the first bias terminal and the first pair of common-mode terminals;
a second variable leaf capacitor having a second bias terminal and a second pair of common-mode terminals, a capacitance of the second variable leaf capacitor dependent on voltages at the second bias terminal and the second pair of common-mode terminals;
a common-mode voltage bias configured to drive the first pair of common mode terminals of the first variable leaf capacitor and the second pair of common mode terminals of the second variable leaf capacitor;
a variable voltage bias coupled to the first bias terminal of the first variable leaf capacitor and configured to drive the first bias terminal to one of a first bias voltage and a second bias voltage to tune the digitally controlled oscillator; and
a digital-to-analog converter coupled to the second bias terminal of the second variable leaf capacitor and configured to drive the second bias terminal to one of a plurality of bias voltage settings to further tune the digitally controlled oscillator, the plurality of bias voltage settings ranging from approximately the first bias voltage to approximately the second bias voltage and comprising at least one intermediate setting between the first bias voltage and the second bias voltage.

7. The digitally controlled oscillator of claim 6, wherein:
the first variable leaf capacitor comprises:
- a first alternating coupling capacitor coupled between a first differential node and a first common-mode node of the first variable leaf capacitor;
- a second alternating coupling capacitor coupled between a second differential node and a second common-mode node of the first variable leaf capacitor; and
- a first varactor coupled between the first bias terminal of the first variable leaf capacitor and the first and second common mode nodes of the first variable leaf capacitor; and the second variable leaf capacitor comprises:
- a third alternating coupling capacitor coupled between a first differential node and a first common-mode node of the second variable leaf capacitor;
- a fourth alternating coupling capacitor coupled between a second differential node and a second common-mode node of the second variable leaf capacitor; and
- a second varactor coupled between the second bias terminal of the second variable leaf capacitor and the first and second common mode nodes of the second variable leaf capacitor.

8. The digitally controlled oscillator of claim 7, wherein the first varactor and the second varactor are metal-oxide-semiconductor-based varactors.

9. The digitally controlled oscillator of claim 7, wherein:
the first variable leaf capacitor has a first capacitance based on capacitances of the first varactor, the first alternating current coupling capacitor, and the second alternating current coupling capacitor; and
the second variable leaf capacitor has a second capacitance based on capacitances of the second varactor, the third alternating current coupling capacitor, and the fourth alternating current coupling capacitor.

10. The digitally controlled oscillator of claim 7, wherein:
a capacitance of the first alternating current coupling capacitor is variable;
a capacitance of the second alternating current coupling capacitor is variable;
a capacitance of the third alternating current coupling capacitor is variable; and
a capacitance of the fourth alternating current coupling capacitor is variable.

\* \* \* \* \*